(12) United States Patent
Billingham et al.

(10) Patent No.: US 11,428,092 B2
(45) Date of Patent: Aug. 30, 2022

(54) WIRELINE AUTOMATION SYSTEMS AND METHODS

(71) Applicant: Schlumberger Technology Corporation, Sugar Land, TX (US)

(72) Inventors: Matthew Billingham, Houston, TX (US); Erwan Olliero, Harahan, LA (US); Adolfo Recio, Clamart (FR); David Schlosser, Fulshear, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 204 days.

(21) Appl. No.: 15/862,822

(22) Filed: Jan. 5, 2018

(65) Prior Publication Data
US 2019/0211664 A1 Jul. 11, 2019

(51) Int. Cl.
*E21B 44/00* (2006.01)
*E21B 23/14* (2006.01)
(Continued)

(52) U.S. Cl.
CPC ............ *E21B 44/005* (2013.01); *E21B 23/14* (2013.01); *E21B 44/00* (2013.01); *E21B 47/00* (2013.01);
(Continued)

(58) Field of Classification Search
CPC ........ E21B 44/005; E21B 44/00; E21B 23/14; G06F 17/5009; G01V 1/46
See application file for complete search history.

(56) References Cited

U.S. PATENT DOCUMENTS

2006/0278394 A1* 12/2006 Stover .................. B60P 1/5433
166/308.1
2008/0035334 A1 2/2008 Newman
(Continued)

FOREIGN PATENT DOCUMENTS

CN 102536210 A 7/2012

OTHER PUBLICATIONS

International Search Report and Written Opinion issued in the related PCT Application PCT/US2019/012457, dated Apr. 30, 2019 (15 pages).
(Continued)

*Primary Examiner* — Abby J Flynn
*Assistant Examiner* — Yanick A Akaragwe
(74) *Attorney, Agent, or Firm* — Ashley E. Brown

(57) ABSTRACT

A well-logging system includes a downhole tool coupled to a cable. The downhole tool may measure physical parameters of a wellbore via a first plurality of sensors. The well-logging system may include wellbore equipment including a winch. The winch may traverse the downhole tool through the wellbore by spooling or unspooling the cable. The well-logging system may also include a second plurality of sensors that may measure operational parameters of the wellbore equipment. The well-logging system may further include an automation controller that is communicatively coupled to the first plurality of sensors and the second plurality of sensors. A set of defined operating instructions may be prepared during the assembly of the job. The automation controller may control the wellbore equipment based at least in part on feedback from the first plurality of sensors, feedback from the second plurality of sensors, and the defined operating instructions.

19 Claims, 5 Drawing Sheets

(51) Int. Cl.
  *G01V 1/46* (2006.01)
  *E21B 47/00* (2012.01)
  *G06F 30/20* (2020.01)
  *E21B 47/002* (2012.01)
  *E21B 47/01* (2012.01)

(52) U.S. Cl.
  CPC ............. *E21B 47/002* (2020.05); *G01V 1/46* (2013.01); *G06F 30/20* (2020.01); *E21B 47/01* (2013.01)

(56) References Cited

U.S. PATENT DOCUMENTS

| | | | |
|---|---|---|---|
| 2010/0147510 A1 | 6/2010 | Kwok et al. | |
| 2013/0160995 A1* | 6/2013 | Ocalan | E21B 19/08 166/250.01 |
| 2015/0134257 A1 | 5/2015 | Erge et al. | |
| 2015/0324344 A1* | 11/2015 | Williams | E21B 47/00 715/226 |
| 2015/0369956 A1* | 12/2015 | Ma | E21B 47/12 250/269.7 |
| 2016/0230532 A1 | 8/2016 | Kasperski et al. | |
| 2016/0290117 A1* | 10/2016 | Dykstra | E21B 44/04 |
| 2017/0107074 A1 | 4/2017 | Georget et al. | |
| 2017/0186512 A1 | 6/2017 | McFarland et al. | |

OTHER PUBLICATIONS

International Preliminary Report on Patentability issued in the related PCT Application PCT/US2019/012457, dated Jul. 16, 2020 (11 pages).
First Office Action issued in Chinese Patent Application 201980014150.9 dated Jun. 7, 2022, 19 pages with English translation.

* cited by examiner ns and Methods

BACKGROUND

This disclosure relates to systems and methods for automation of a wireline system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as an admission of any kind.

Producing hydrocarbons from a wellbore drilled into a geological formation is a remarkably complex endeavor. In many cases, decisions involved in hydrocarbon exploration and production may be informed by measurements taken with downhole well-logging tools that are conveyed deep into the wellbore. The measurements may be used to infer properties and characteristics of the geological formation surrounding the wellbore. Thus, when a wellbore is investigated to determine the physical condition of a fluid within the wellbore, a gas within the wellbore, or the wellbore itself, it may be desirable to place downhole well-logging tools with associated measurement tools and/or sensors within the wellbore.

In some cases, a well-logging system may be used to convey the downhole well-logging tools through the geological formation. For example, the well-logging system may include a winch that spools or unspools a cable, such that the cable may be used to raise or lower the downhole well-logging tool within a casing of the wellbore. In many cases, the well-logging system may include an array of additional components, such as pressure control equipment, cranes, service trucks, generators, etc., which facilitate operation of the well-logging system. In certain cases, a substantially large crew of service technicians may operate the various components of the well-logging system. Unfortunately, employing a crew of service technicians is expensive and may result in inefficient operation of the well-logging system.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one example, a well-logging system includes a downhole tool coupled to a cable. The downhole tool may measure physical parameters of a wellbore via a first plurality of sensors. The well-logging system may include wellbore equipment including a winch. The winch may traverse the downhole tool through the wellbore by spooling or unspooling the cable. The well-logging system may also include a second plurality of sensors that may measure operational parameters of the wellbore equipment. The well-logging system may further include an automation controller that is communicatively coupled to the first plurality of sensors and the second plurality of sensors. The automation controller may control the wellbore equipment based at least in part on feedback from the first plurality of sensors, feedback from the second plurality of sensors, and defined operating instructions.

In another example, a wellbore automation system includes a data acquisition system that is communicatively coupled to a first plurality of sensors coupled to a downhole tool. The downhole tool is configured to measure physical parameters of a wellbore. The wellbore automation system also includes a second plurality of sensors that are configured to measure operating parameters of wellbore equipment of a well-logging system. The wellbore automation system further includes an automation controller that is communicatively coupled the first plurality of sensors and the second plurality of sensors. The automation controller may control operation of the wellbore equipment based at least in part on feedback from the first plurality of sensors, the second plurality of sensors, and defined operating instructions.

In another example, a method of operating a wellbore automation system includes receiving defined operating instructions. The defined operating instructions include instructions for controlling wellbore equipment of a well-logging system. The method also includes measuring physical parameters of a wellbore using a first plurality of sensors. The first plurality of sensors are coupled to a downhole tool disposed within the wellbore. The method further includes measuring operating parameters of the wellbore equipment using a second plurality of sensors and controlling the wellbore equipment based at least in part on the defined operating instructions, feedback from the first plurality of sensors, feedback from the second plurality of sensors, or any combination thereof.

Various refinements of the features noted above may be undertaken in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

Figure 1:
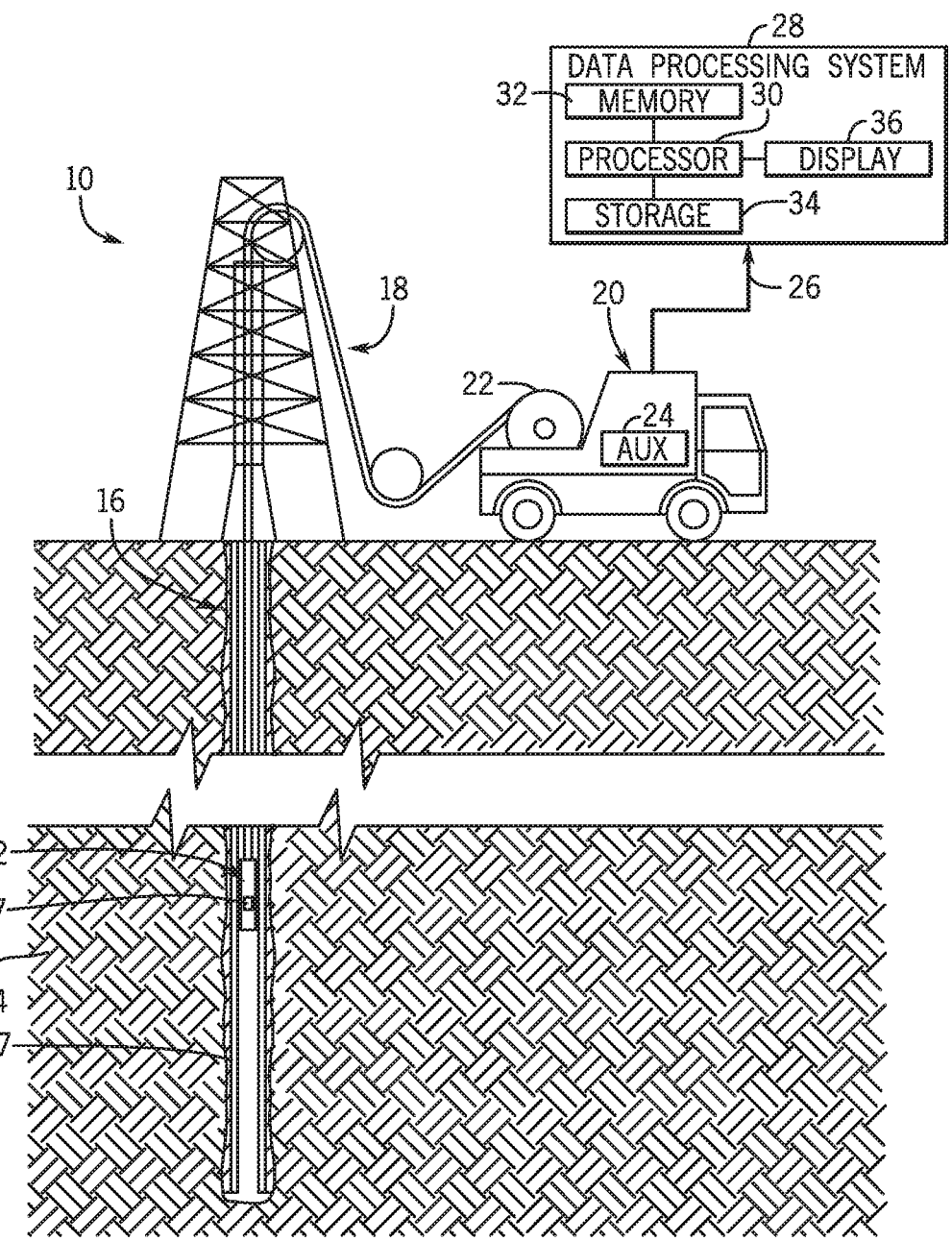
FIG. 1 is a schematic diagram of a well-logging system, in accordance with an embodiment of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Downhole tools may be conveyed through a wellbore using a cable that is spooled or unspooled on a winch. Accordingly, the downhole tool may be used to investigate physical characteristics of fluids or gases within the wellbore and/or a casing of the wellbore. In certain cases, a well-logging system may be used to facilitate traversing the downhole tool through the wellbore. The well-logging system may include an array of components that enable the downhole tool to collect data from within the wellbore. For example, the well-logging system may include components such as the winch, a crane, a tool handling system, pressure control equipment, a data logging system, or any other suitable components to facilitate exploration of the wellbore. Typically, many of these components are operated individually by a designated service technician. For example, one service technician may operate the winch, while other service technicians each operate the crane, the tool handling system, the pressure control equipment, or other suitable components of the well-logging system. Accordingly, typical well-logging systems may be operated by a substantially large crew of service technicians (e.g., 5 service technicians or more). Unfortunately, employing a crew of service technicians may be expensive and, in some cases, hinder the well-logging system from operating efficiently (e.g., due to human error).

In addition, it may be expensive and time consuming to assemble the well-logging system using the crew of service technicians. For example, multiple service technicians may each operate machinery that facilitates assembly of certain components of the well-logging system. Typically, one service technician may be trained to operate a service vehicle (e.g., a tractor trailer assembly) that delivers components of the well-logging system to a well site, while another service technician may be trained to operate the crane and/or tool handling system, which may unload the delivered components from the service vehicle. Yet another service technician may be trained to assemble the crane and/or the tool handling systems prior to the arrival of the service vehicle at the well site. Similarly to the discussion above, a large crew of service technicians may be expensive to employ and decrease an operational efficiency of the well-logging system.

To facilitate assembly of the well-logging system, and enable operation of the well-logging system with a substantially small crew of service technicians (e.g., two service technicians or less), a wellbore automation system may be used. The wellbore automation system may be used to automate the assembly of the job and/or to automate the job execution. Indeed, the wellbore automation system may facilitate the assembly of the job by identifying or collecting job specifications, which may be used to define the scope of the job and/or define or select instructions. For example, defined instructions may include job level descriptions for the wellbore automation system to execute. The job level descriptions may include executable tasks such as instructions that may specify along which section(s) of the wellbore to obtain certain measurements, if a portion of the casing within the wellbore should be perforated (e.g., using a perforator coupled to the downhole tool), or any additional well-logging operations Aside from automating the assembly of the job of the well-logging system, the wellbore automation system may, additionally or alternatively, communicatively couple certain components of the well-logging system, such that these components may be operated using a remote of the wellbore automation system. For example, the remote may enable a service technician to operate all components of the well-logging system that may be communicatively coupled to the wellbore automation system. The wellbore automation system may also include an automation controller, which may autonomously control certain components of the well-logging system. The automation controller may store defined instructions that enable the automation controller to monitor and adjust certain operational parameters of the well-logging system. In such an example, the automation controller may operate the winch, such that the automation controller may autonomously direct the downhole tool through the wellbore. Accordingly, the automation controller may enable automation of substantially all of the well-logging system, such that an efficiency of the well-logging system may be enhanced.

With the foregoing in mind, FIG. 1 illustrates a well-logging system 10 that may employ the systems and methods of this disclosure. The well-logging system 10 may be used to convey a downhole tool 12 or a dummy weight through a geological formation 14 via a wellbore 16. In some embodiments, a casing 17 may be disposed within the wellbore 16, such that the downhole tool 12 may traverse the wellbore 16 within the casing 17. The downhole tool 12 may be conveyed on a cable 18 via a logging winch system 20. Although the logging winch system 20 is schematically shown in FIG. 1 as a mobile logging winch system carried by a truck, the logging winch system 20 may be substantially fixed (e.g., a long-term installation that is substantially permanent or modular). Any cable 18 suitable for well logging may be used. The cable 18 may be spooled and unspooled on a winch 22 and an auxiliary power source 24 may provide energy to the logging winch system 20 and/or the downhole tool 12.

In some embodiments, the downhole tool 12 may include one or more sensors 27 that enable the downhole tool 12 to measure geophysical and/or petrophysical properties of the wellbore 16 and/or properties of the casing 17 disposed within the wellbore 16. For example, the one or more sensors 27 may include accelerometers, rate sensors, pressure transducers, electromagnetic sensors, acoustic sensors, or any additional suitable sensors. Accordingly, the downhole tool 12 may provide logging measurements 26 to a data processing system 28 via any suitable telemetry (e.g., via electrical or optical signals pulsed through the geological formation 14 or via mud pulse telemetry). The data processing system 28 may thus process the logging measurements 26. The logging measurements 26 may indicate certain properties of the wellbore 16 and/or the casing 17 (e.g., pressure, temperature, strain, vibration, or other) that might otherwise be indiscernible by a human operator.

To this end, the data processing system 28 thus may be any electronic data processing system that can be used to carry out the systems and methods of this disclosure. For example, the data processing system 28 may include a processor 30, which may execute instructions stored in memory 32 and/or storage 34. As such, the memory 32 and/or the storage 34 of the data processing system 28 may be any suitable article of manufacture that can store the instructions. The memory 32 and/or the storage 34 may be ROM memory, random-access memory (RAM), flash memory, an optical storage medium, or a hard disk drive, to name a few examples. A display 36, which may be any suitable electronic display, may provide a visualization, a well log, or other indication of properties in the geological formation 14 or the wellbore 16 using the logging measurements 26.

Figure 2:
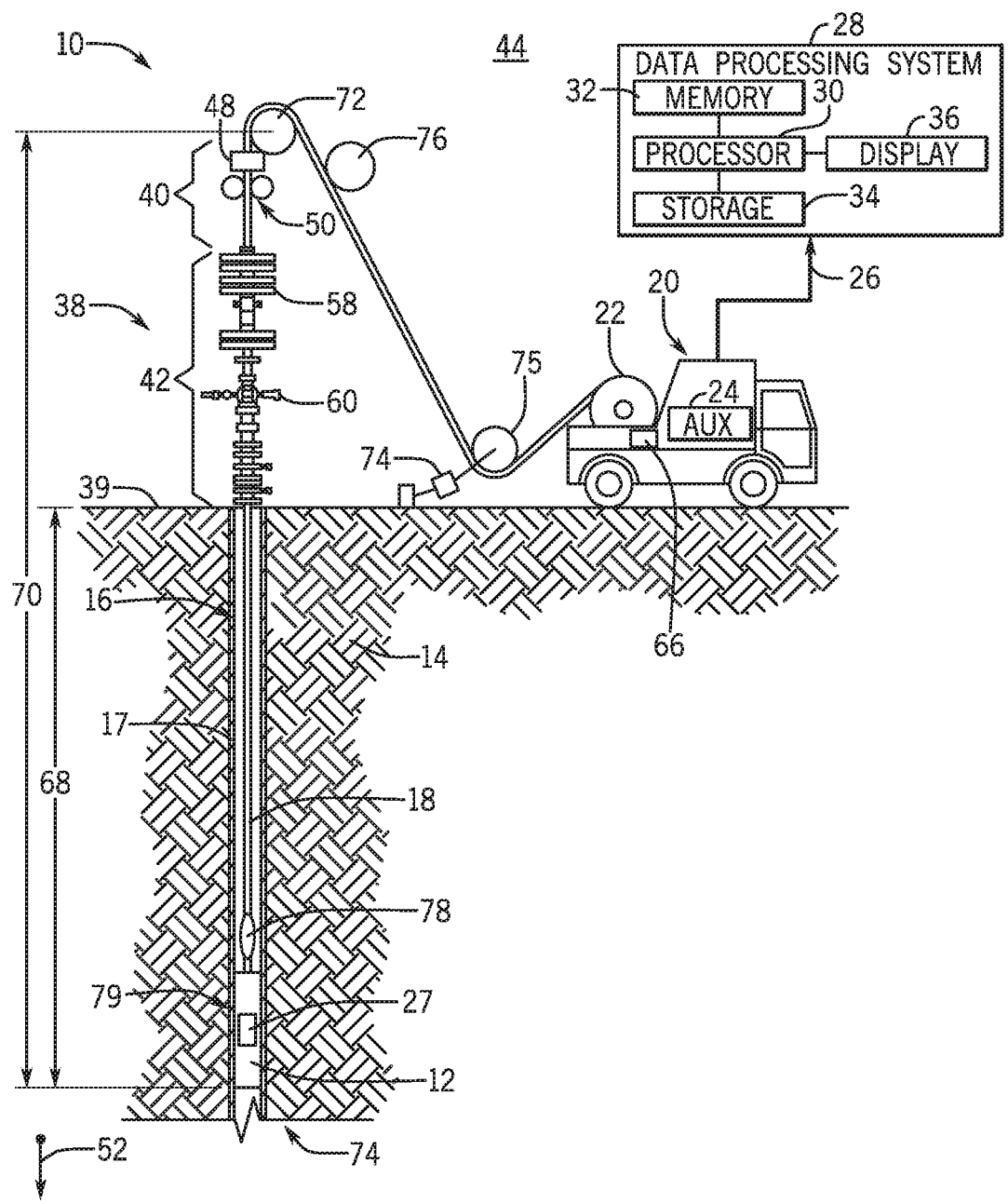
FIG. 2 is a schematic diagram of an embodiment of the well-logging system of FIG. 1, in accordance with an embodiment of the present disclosure.

FIG. 2 illustrates an exemplary embodiment of the well-logging system 10 of FIG. 1, illustrating pressure control equipment 38 disposed near a surface 39 of the geological formation 14. As described in greater detail herein, the pressure control equipment 38 may include an upper assembly 40 and a lower assembly 42, which may enable the cable 18 to move the downhole tool 12 through the wellbore 16, while blocking pressurized fluid within the wellbore 16 from leaking into an ambient environment 44 (e.g., the atmosphere). For example, the upper assembly 40 of the pressure control equipment 38 may include a stuffing box 48, which forms a fluidic seal around the cable 18. In some embodiments, the cable 18 may pass through an annular opening within the stuffing box 48, which may be configured to conform to an external surface of the cable 18, thus forming the fluid seal.

The upper assembly 40 may also include one or more motorized rollers 50 that may guide the cable 18 while the cable 18 spools or unspools from the winch 22. In some embodiments, the motorized rollers 50 may be powered to rotate (e.g., through a hydraulic motor) and apply a force to the cable 18 along in a downhole direction 52. Accordingly, the motorized rollers 50 may facilitate lowering the downhole tool 12 into the wellbore 16 during initial operation of the well-logging system 10 while a tension on the cable 18 (e.g., due to a weight of the downhole tool 12 and a weight of the cable 18 itself) is substantially small. As described in greater detail herein, once a certain length of cable 18 is lowered into the wellbore 16, the weight of the downhole tool 12 and the cable 18 may unspool the cable 18 from the winch 22 and move the cable 18 though the pressure control equipment 38 without input from the motorized rollers 50. In some embodiments, the upper assembly 40 may include additional or fewer components than those described above.

In some embodiments, the lower assembly 42 of the pressure control equipment 38 may include a lubricator 58 disposed above a regulating valve 60 (e.g., a blowout preventer, a Christmas tree). The lubricator 58 may enable the downhole tool 12 to lower into the wellbore 16 from above the surface 39 while the wellbore 16 is pressurized. For example, the downhole tool 12 may be placed within the lubricator 58 while the regulating valve 60 is closed. The regulating valve 60 may open at a defined rate while the downhole tool 12 is disposed within the lubricator 58. Accordingly, a pressure differential between an internal region of the lubricator 58 and the wellbore 16 may neutralize, such that the downhole tool 12 may be lowered into the wellbore 16. In some embodiments, the lower assembly 42 may include additional or fewer components than those described above. For example, the lower assembly may additionally include a tool trap, a pump-in-sub, a cable shearing device, or any other suitable components.

A depth 68 of the downhole tool 12 may be monitored using a plurality of sensors included in the well-logging system 10. In some embodiments, the depth 68 of the downhole tool 12 may be determined by monitoring a tension on the cable 18. The tension of the cable 18 may be monitored by measuring a torque imposed on the winch 22 using a torque sensor 66. For example, a suspended weight of the cable 18 may be indicative of a suspended length 70 of the cable 18. The suspended length 70 may extend between an upper spool 72 of the well-logging system 10 and a lower end portion 74 of the downhole tool 12. Accordingly the suspended weight of the cable 18 may increase while the downhole tool 12 is lowered into the wellbore 16 (e.g., because of an increase in the suspended length 70). An increase in the suspended weight may increase a tension on the cable 18 and, thus, a torque applied to the winch 22 by the cable 18. Accordingly, the torque measured by the torque sensor 66 may be indicative of the depth 68 of the downhole tool 12. In some embodiments, the torque sensor 66 may be communicatively coupled to the data processing system 28. As such, the data processing system 28 may evaluate data (e.g., torque measurements) received from the torque sensor 66 and determine the depth 68 of the downhole tool 12 using defined correlations between the measured torque and the suspended weight of the cable 18.

In some embodiments, a strain gauge 74 may be used to monitor the depth 68 of the downhole tool 12. For example, the strain gauge 74 may be coupled to a substantially stationary object (e.g., an anchor disposed within the geological formation 14) and a movable idler spool 75 that guides the cable 18. Accordingly, a tension (e.g., stain) on the strain gauge 74 may increase when the suspended length 70 of the cable 18 and, thus, the suspended weight of the cable 18 increases. Similarly to the operation of the torque sensor 66, the strain gauge 74 may be communicatively coupled to the data processing system 28, such that the data processing system 28 may determine the depth 68 of the downhole tool 12 using the tension measurements acquired by the strain gauge 74 and a defined correlation (e.g., an empirically determined correlation) between these tension measurements and the depth 68.

In certain embodiments, the depth 68 of the downhole tool 12 may be measured by an indicator spool 76 that is configured to measure a length of the cable 18 that is unspooled from the winch 22. For example, the indicator spool 76 may be rotatably coupled to the cable 18, such that the indicator spool 76 is rotated while the cable 18 is spooled or unspooled. In some embodiments, a length of the cable 18 that is unspooled may thus be determined by tracking a number of rotations completed by the indicator spool 76. For example, each rotation of the indicator spool 76 may be indicative of unspooling a length of the cable 18 that is proportional to a circumferential distance of the indicator spool 76. The number of rotations completed by the indicator spool 76 may be monitored by the data processing system 28, such that the depth 68 of the downhole tool 12 may be determined.

In yet further embodiments, the depth 68 of the downhole tool 12 may be evaluated using one or more sensors 78 coupled to a lower end portion 79 of the cable 18. For example, accelerometers, rate sensors, pressure transducers, electromagnetic sensors, acoustic sensors, or any other suitable sensors may be used to detect a rate at which the downhole tool 12 is descending into the wellbore 16. Accordingly, the depth 68 of the downhole tool 12 may be determined given a time interval throughout which the downhole tool 12 is descending. In some embodiments, the one or more sensors 27 disposed within the downhole tool 12 may be used to determine the depth 68 of the downhole tool 12 in addition to, or in lieu of, the one or more sensors 78 of the cable 18.

Figure 3:
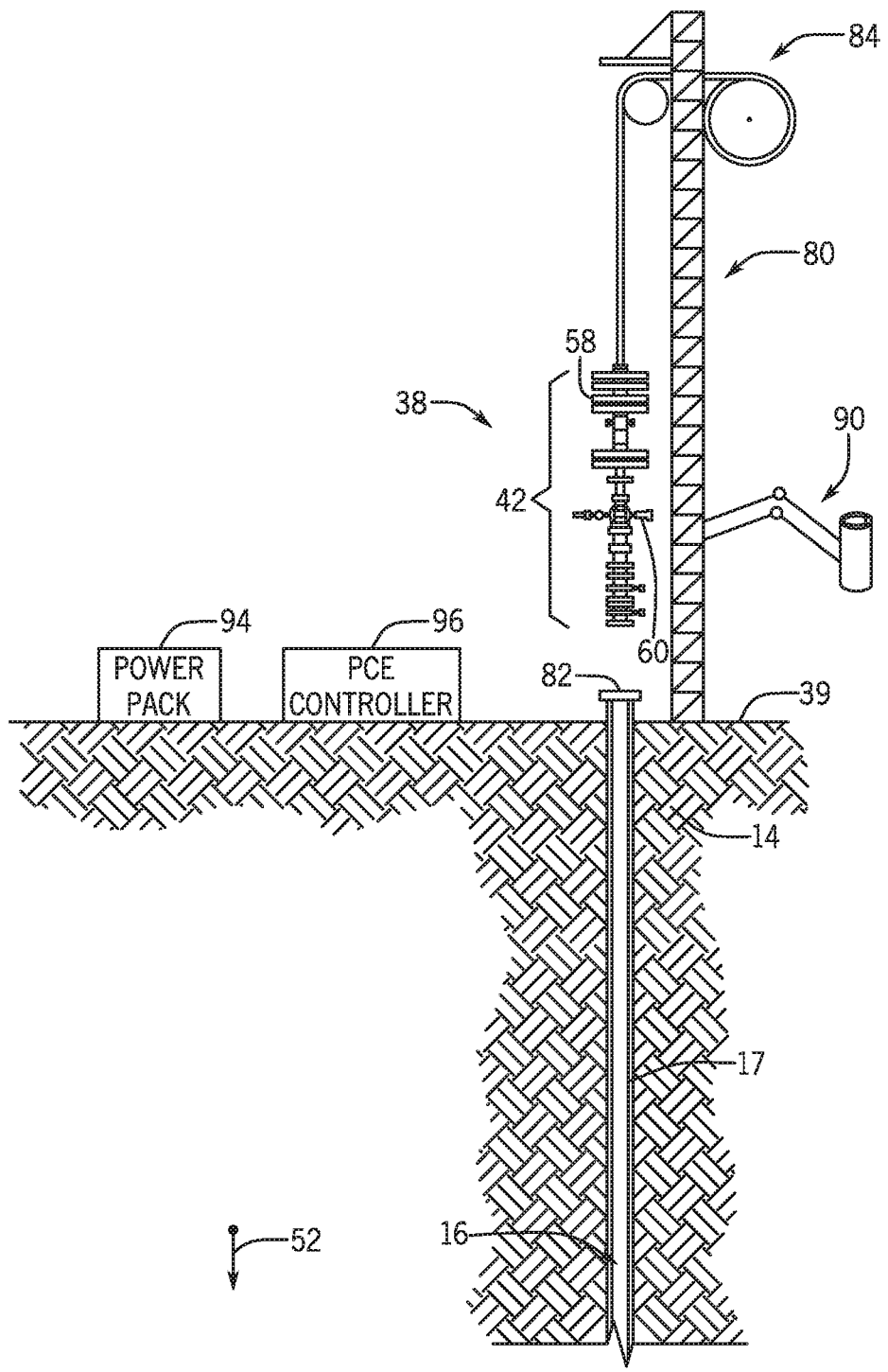
FIG. 3 is a schematic diagram of an embodiment of the well-logging system of FIG. 2, in accordance with an embodiment of the present disclosure.

FIG. 3 illustrates an exemplary embodiment of the well-logging system 10 of FIG. 2, illustrating a crane 80 that may be used to assemble and/or operate certain components of the well-logging system 10. Although the crane is 80 shown as a substantially fixed structure in the illustrated embodiment, it should be noted that the crane 80 may be substantially modular, such as a crane coupled to a mobile service truck. In some embodiments, the crane 80 may raise or lower certain components of the well-logging system 10 (e.g., the pressure control equipment 38) using a cable and winch assembly 84, which may facilitate assembly of the well-logging system 10. For example, the crane 80 may be used to concentrically align the pressure control equipment 38 with a cap 82 of the wellbore 16, such that the pressure control equipment 38 may be coupled to the cap 82 during assembly of the well-logging system 10. In such an example, the crane 80 may facilitate coupling the lower assembly 42 of the pressure control equipment 38 to the cap 82 and subsequently facilitate coupling the upper assembly 40 to the lower assembly 42. In certain embodiments, the crane 80 may use a hydraulically actuated boom to raise or lower components of the well-logging system 10 in addition to, or in lieu of, the cable and winch assembly 84.

In some embodiments, the crane 80 may include a tool handling system 90, which may facilitate assembly of the pressure control equipment 38, or any suitable components of the well-logging system 10. For example, in one embodiment, the crane 80 may suspend the lubricator 58 above the surface of the wellbore 16 while the tool handling system 90 may grasp an align the regulating valve 60 with the lubricator 58. Accordingly, an operator (e.g., a service technician) may couple the regulating valve 60 to the lubricator 58 before the lower assembly 42 of the pressure control equipment 38 is coupled to the cap 82. In other embodiments, the tool handling system 90 may be a component separate of the crane 80.

In certain embodiments, the crane 80 and/or the tool handling system 90 may be used to position a power pack 94 (e.g., an auxiliary power unit) and/or a pressure control equipment controller 96 (referred to herein as a PCE controller) near the wellbore 16. For example, the crane 80 and/or the tool handling system 90 may enable the power pack 94 and/or the PCE controller 96 to be unloaded from a transportation vehicle (e.g., a tractor trailer) and disposed in a suitable position within the well-logging system 10. In some embodiments, the power pack 94 may provide electrical energy to the well-logging system 10 in addition to, or in lieu of, the auxiliary power source 24. For example, the power pack 94 may be used to provide electrical energy to the PCE controller 96, the downhole tool 12, and/or the entire well-logging system 10 itself. In some embodiments, the power pack 94 may include one or more internal combustion engines (e.g., a diesel engine, a gasoline engine) that may operate an electrical generator which generates the electric energy. As described in greater detail herein, the PCE controller 96 may be communicatively coupled to the pressure control equipment 38, the data processing system 28, or an external control base, such that the PCE controller 96 may monitor and adjust operational parameters of the pressure control equipment 38.

As discussed above, assembling, monitoring, and operating the well-logging system 10 may require a substantially large crew of service technicians. For example, the crew of service technicians may include 3, 4, 5, 6, 7, 8, 9, 10, or more service technicians. The service technicians may monitor and control various aspects of the well-logging system 10. For example, a service technician may operate the winch 22 while another service technician may observe tension measurements acquired by the torque sensor 66, the stain gauge 74, the one or more sensors 27, 78, or any combination thereof. Other service technicians may operate and/or monitor the motorized rollers 50, the crane 80, the tool handling system 90, the PCE controller 96, the power pack 94, or any suitable components of the well-logging system 10.

Figure 4:
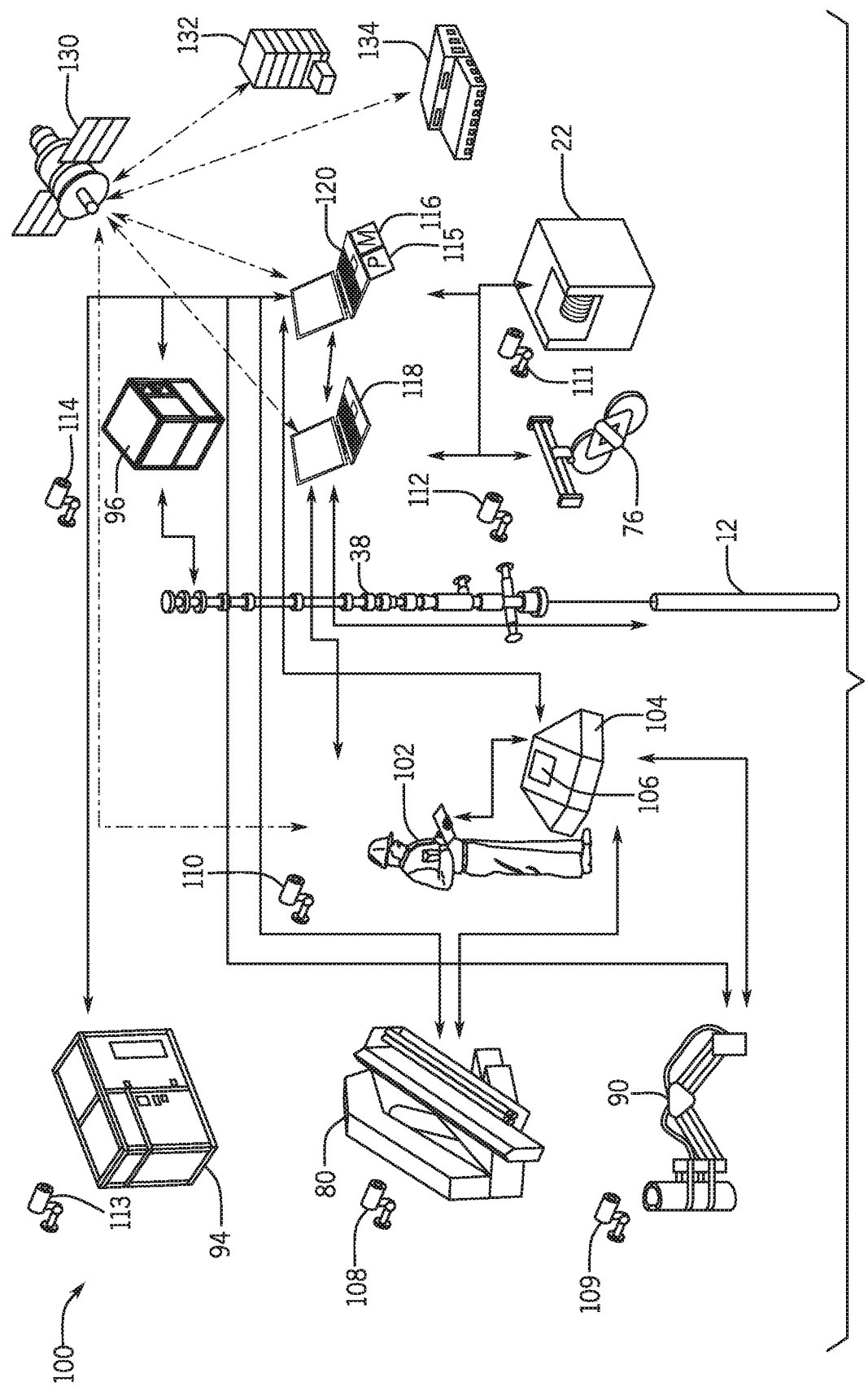
FIG. 4 is a wellbore automation system that may be used to automate the well-logging system of FIGS. 1-3, in accordance with an embodiment of the present disclosure.

With the foregoing in mind, FIG. 4 illustrates a schematic diagram of a wellbore automation system 100 that may be used to automate substantially all operations of the well-logging system 10. As described in greater detail herein, the wellbore automation system 100 may enable a single operator 102, or a pair of operators, to monitor and/or control the well-logging system 10. In some embodiments, the wellbore automation system 100 may include a remote 104 that is communicatively coupled to certain components of the well-logging system 10. For example, the remote 104 may be communicatively coupled to the crane 80 and the tool handling system 90. In some embodiments, the remote 104 may enable the operator 102 to control the crane 80 and/or the tool handling system 90 from a location remote of these components. For example, the operator 102 may be positioned in a location in which the operator 102 has an unobstructed line of sight to both the crane 80 and the tool handling system 90. Accordingly, the operator 102 may visually monitor the crane 80, the tool handling system 90, or both, and operate each of these components using the remote 104.

In some embodiments, the operator 102 may be unable to obtain an unobstructed line of sight to the crane 80 and/or the tool handling system 90. The wellbore automation system 100 may thus include a crane camera 108 and a tool handling camera 109, which are directed toward the crane 80 and the tool handling system 90, respectively. The cameras 108, 109 may be communicatively coupled to the wellbore automation system 100 and may transmit image data and/or video data acquired by the cameras 108, 109 to the remote 104. In some embodiments, the remote 104 may include a display 106 (e.g., a light emitting diode display) through which the operator 102 may view substantially real time images and/or video obtained by the cameras 108-110. Throughout this disclosure, the term "real time" indicates that the images and/or video are obtained and/or provided in a timeframe substantially close to the time of actual observation. Accordingly, the operator 102 may monitor the crane 80 and/or the tool handling system 90 through the display 106 and thus operate the crane 80, the tool handling system 90, or both.

In certain embodiments, the operator 102 may be positioned within a field of view (e.g., an area under observation) of an operator camera 110. The operator camera 110 may be disposed above the operator 102, such that the operator 102 may observe an environment surrounding the operator 102 from an aerial perspective (e.g., through a "bird's eye" view). Accordingly, the operator 102 may monitor certain components of the well-logging system 10 that may be disposed adjacent to the operator 102. For example, the operator 102 may reposition when the crane 80 or the tool handling system 90 move within a threshold radial distance of the operator 102. As such, the operator camera 110 may enable the operator 102 to be disposed a suitable distance away from certain components of the well-logging system 10.

Additionally or otherwise, the remote 104 may be communicatively coupled to any other suitable components of the well-logging system 10, such as the winch 22, the indicator spool 76, the power pack 94, and/or the PCE controller 96. In some embodiments, additional cameras may be directed at certain components of the well-logging system 10, such that the operator 102 may visually monitor these components through the display 106. For example, the wellbore automation system 100 may include a winch camera 111, an indicator spool camera 112, a power pack camera 113, and/or a PCE controller camera 114, which are directed toward the winch 22, the indicator spool 76, the power pack 94, and the PCE controller 96, respectively. Additionally or alternatively, the wellbore automation system 100 may include additional or fewer cameras than those described above. Accordingly, the operator 102 may monitor and control each of the above listed components, or any additional suitable components of the well-logging system 10, using the remote 104 and/or the real time video data generated by the cameras 108-114.

In some embodiments, the remote 104 may be communicatively coupled to an automation controller 120 of the wellbore automation system 100. As described in greater detail herein, the automation controller 120 may include processing software that may enable the automation controller 120 to autonomously control certain components of the well-logging system 10. For example, one or more control signal transfer devices, such as wires, cables, wireless communication devices, and the like, may communicatively couple the automation controller 120 to components of the well-logging system 10, such as the crane 80, the tool handling system 90, the power pack 94, the PCE controller 96, the winch 22, the indicator spool 76, or any other suitable components.

The automation controller 120 includes a processor 115 (e.g., a microprocessor) that may execute software, such as software for controlling the components of the well-logging system 10. As discussed in greater detail herein, the automation controller 120 may include, or be operatively coupled to, or otherwise receive information from one or more features of a tool planner such as the TOOLPLANNER™ framework, and/or a data acquisition system that interfaces with sensors of a downhole tool such as the MAXWELL™ framework and/or the eWAFE™ framework. Moreover, the processor 115 may include multiple microprocessors, one or more "general-purpose" microprocessors, one or more special-purpose microprocessors, and/or one or more application specific integrated circuits (ASICS), or some combination thereof. For example, the processor 115 may include one or more reduced instruction set (RISC) processors.

The automation controller 120 also includes a memory device 116 that may store information such as low level executable job instructions, control software, look up tables, configuration data, etc. The memory device 116 may include a volatile memory, such as random access memory (RAM), and/or a nonvolatile memory, such as read-only memory (ROM). The memory device 116 may store a variety of information and may be used for various purposes. For example, the memory device 116 may store processor-executable instructions (e.g., firmware or software) for the processor 115 execute, such as instructions for controlling components of the well-logging system 10. In some embodiments, the memory device 116 is a tangible, non-transitory, machine-readable-medium that may store machine-readable instructions for the processor 115 to execute. The memory device 116 may include ROM, flash memory, a hard drive, or any other suitable optical, magnetic, or solid-state storage medium, or a combination thereof.

In some embodiments, the automation controller 120 may be communicatively coupled to a data acquisition system 118 (e.g., the data processing system 28). The automation controller 120 may occasionally or continuously receive data from the data acquisition system 118 that is indicative of operational conditions of the well-logging system 10, measurements acquired by the downhole tool 12, or any other suitable data of the well-logging system 10. As described in greater detail herein, these data measurements may enable the automation controller 120 to autonomously perform various operational tasks of the well-logging system 10. Additionally, the automation controller 120 may control the well-logging system 10 based on defined well site job instructions. The defined well site job instructions may be generated at the time of job preparation and planning (e.g., by a field engineer) or automatically based on known characteristics of the well prior to operation of the well-logging system 10.

A communication device 130 (e.g., a satellite) may communicatively couple the operator 102 (e.g., via a cellular phone of the operator 102, via the remote 104), the automation controller 120, and the data acquisition system 118 to an operational support center 132 (referred to hereinafter as an OSC) and/or a base 134. The OSC 132 may include various trained service technicians (e.g., field experts) that may assist the operator 102 when the non-standard operation is performed or a non-standard operating condition is detected. For example, the service technicians stationed at the OSC 132 may remotely operate certain components of the well-logging system 10 in addition to, or in lieu of, the operator 102 during such cases.

In some embodiments, the automation controller 120 of wellbore automation system 100 may automatically communicate with the OSC 132 (e.g., using the communication device 130) when a non-standard or especially sensitive operation is to be performed or when a non-standard operational condition is detected. A non-standard or especially sensitive operation may be any operation that, for any operational reasons, may benefit from human control or responsibility. A non-standard operational condition may be any operational condition that falls outside of an expected or normal threshold, and/or which may represent a condition that would benefit from additional human review. As described in greater detail herein, the automation controller 120 may request approval from the OSC 132 before proceeding with autonomous operation of the well-logging system 10 when such a non-standard operational condition is detected. For example, the automation controller 120 may pause autonomously operating the well-logging system 10 during non-standard operations, such that a human operator (e.g., the operator 102, an additional service technician stationed at the OSC 132) may approve the non-standard operation, or remotely control operation of the well-logging system 10 to perform the non-standard operation (e.g., via the remote 104), before the wellbore automation system 100 resumes normal operation.

In some embodiments, the base 134 may include multiple service technicians that monitor operation of the well-logging system 10 in addition to, or in lieu of the operator 102 and/or the OSC 132. For example, the service technicians within the base 134 may control the well-logging system 10 remotely through the transmission of executable instructions to the automation controller 120 via the communication device 130. Accordingly, the OSC 132, the base 143, or both, may assist the operator 102 or the automation controller 120 in controlling the well-logging system 10.

Figure 5:
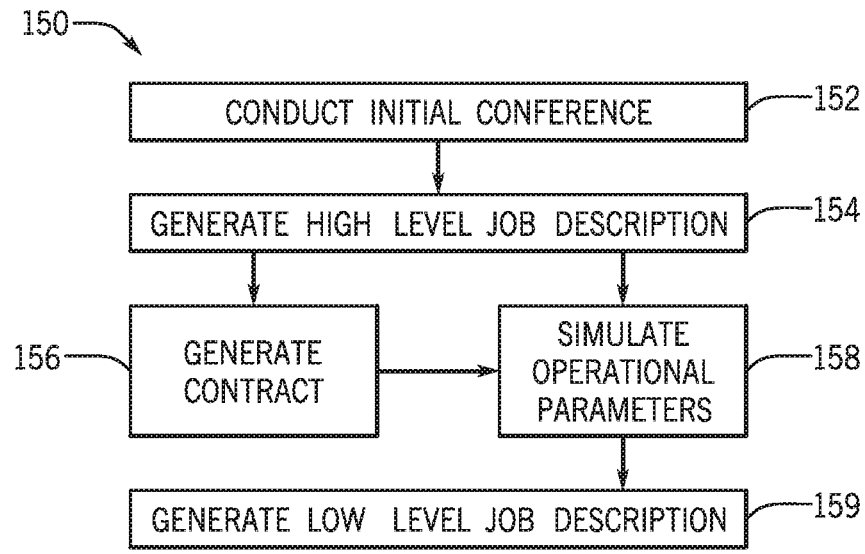
FIG. 5 is a flow diagram of an embodiment of a method of generating operational instructions for the wellbore automation system of FIG. 4, in accordance with an embodiment of the present disclosure.

FIG. 5 is an embodiment of a method 150 that may be used to generate well site job instructions for the automation controller 120 to execute. As discussed above, the automation controller 120 may execute the well site job instructions to autonomously operate the well-logging system 10 and acquire measurements along the wellbore 16 using the downhole tool 12. The method 150 may include conducting (process block 152) an initial conference between a field engineer (e.g., the operator 102) and a customer desiring to use the well-logging system 10 to perform certain well-logging operations. For example, the customer may desire to use the well-logging system 10 to measure certain wellbore parameters (e.g., density, porosity) along a portion, or portion(s) of the wellbore 16 and/or the casing 17. The operator 102 and the customer may agree as to which deliverables (e.g., certain wellbore parameters to be measured) the well-logging system 10 may aim to produce.

Accordingly, the operator 102 and the customer may generate (process block 154) a high level job description of wellbore operations to be performed by the well-logging system 10, such that the high level job description may be input into the automation controller 120. In some embodiments, the high level job description may additionally include previously determined geophysical and/or petrophysical parameters of the wellbore 16 such as stand-off, formation triaxial stresses, surface roughness, and so on. The high level job description may use a syntax, nomenclature, and/or grammar that is understood by both the operator 102 and the customer. As such, the operator 102 and the customer may generate (process block 156) a contract (e.g., a physical or virtual contract), which defines the desired deliverables to be generated by the well-logging system 10.

The high level job description and/or the contract may be communicated to the TOOLPLANNER™ framework and/or the MAXWELL™ framework included within the automation controller 120, which may simulate (process block 158) the operational parameters specified in the high level job description in a model. For example, the TOOLPLANNER™ framework may be used generate a virtual model of the well site, which may be used by the automation controller 120 to estimate expected wellbore parameters of the physical well site. For example, the TOOLPLANNER™ framework may generate a model of the downhole tool 12 and simulate operation of the downhole tool 12 within the wellbore 16 given the previously determined geophysical and/or petrophysical parameters of the wellbore 16. Accordingly, the TOOLPLANNER™ framework may analytically estimate certain operational parameters of the well-logging system 10 before the well-logging system 10 begins operation at the well site.

The high level job description and/or the simulation may be used to generate (process block 159) a low level job description using the MAXSHELL™ scripting language. The low level job description may include technical details that are extracted from the high level job description and the simulation results of the TOOLPLANNER™ framework. As discussed above, the simulation results may be used to estimate certain operating conditions of the well-logging system 10, before the well-logging system 10 is moved to the well site. Accordingly, certain components of the well-logging system 10 may be adjusted or calibrated to operate efficiently under the expected well site operating conditions predicted via the simulation. As such, the low level job description may enable the well-logging system 10 to be tailored to a particular task and/or operate at a particular well site which may enhance operation of the well-logging system 10 at that particular well site.

The wellbore automation system 100 may enable the components of the well-logging system 10 to autonomously execute certain portions of the low level job description. As a non-limiting example, the low level job description may include executable instructions to be performed by the winch 22, such that the winch 22 may move the downhole tool 12 along the portion, or portion(s) of the wellbore 16 previously specified by the customer. It should be noted that suitable portions of the method 150 may be executed by the processor 30 of the data processing system 28, the processor 115 of the automation controller 120, and/or an additional processor. In some embodiments, the low level job descriptions may be stored in the memory devices 32, 116, or an external memory device (e.g., a universal serial bus (USB) device).

Figure 6:
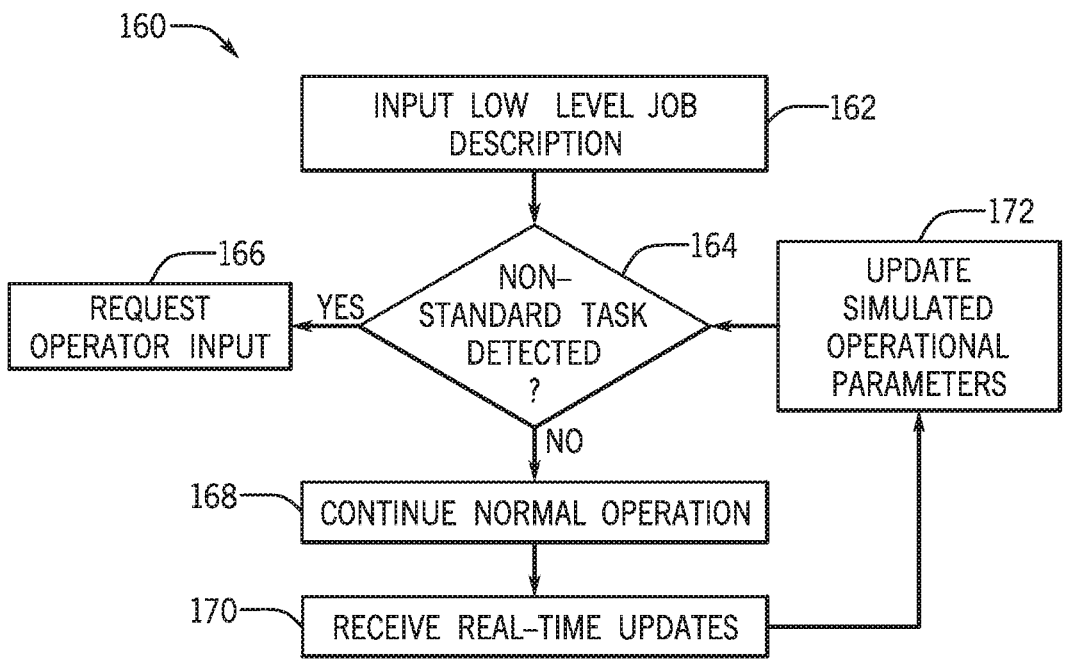
FIG. 6 is a flow diagram of an embodiment of a method of operating the wellbore automation system of FIG. 4, in accordance with an embodiment of the present disclosure.

With the foregoing in mind, FIG. 6 is an embodiment of a method 160 that may be used to execute the low level job descriptions using the wellbore automation system 100. The method may include inputting (process block 162) the low level job description into the automation controller 120. As discussed above, in some cases, the low level job description may already be stored in the memory device 32 of the data processing system 28 and/or the memory device 116 of the automation controller 120. In some embodiments, the communication device 130 may transmit the low level job descriptions to the automation controller 120 from a remote location (e.g., the OSC 132, the base 134). In other embodiments, the operator 102 may download the low level job descriptions from a remote storage device (e.g., the USB device).

In some embodiments, the low level job descriptions may include defined instructions that facilitate assembly of the well-logging system 10 at a well site. As such, the automation controller 120 may assist assembling and/or autonomously assemble certain components of the well-logging system 10. For example, the low level job descriptions may instruct the automation controller 120 to autonomously control the crane 80, such that the crane 80 may move certain components of the pressure control equipment 38 toward a position in which the operator 102 may assemble these components. In such an example, the automation controller 120 may instruct the crane 80 to position the lower assembly 42 of the pressure control equipment 38 concentric to the cap 82 of the wellbore 16. In some embodiments, the automation controller 120 may also operate the crane 80 based at least in part form visual information acquired via one or more of the cameras 108-114. When the lower assembly 42 is coupled to the cap 82, the automation controller 120 may automatically move the crane 80 to retrieve the upper assembly 40 of the pressure control equipment 38. The automation controller may use the crane 80 to concentrically align the upper assembly 40 with the lower assembly 42, such that the operator 102 may couple the assemblies 40, 42.

Accordingly, the low level job descriptions may enable the automation controller 120 facilitate assembly of certain portions of the well-logging system 10. It should be noted that the low level descriptions may additionally include defined instructions that enable the automation controller 120 to facilitate assembly, or autonomously assemble, other portions of the well-logging system 10 such as the power pack 94, the PCE controller 96, the winch 22, or any otherwise suitable components.

When the well-logging system 10 is assembled at a well site, the wellbore automation system 100 may autonomously operate the well-logging system 10 in order to generate the desired outputs specified in the contract and/or the high level job description. For example the wellbore automation system 100 may autonomously control spooling of the winch 22, such that the wellbore automation system 100 may move the downhole tool 12 through the wellbore 16. As discussed above, the low level instructions may specify along which portion, or portions of the wellbore 16 (e.g., at which depth(s) 68) to acquire certain data measurements using the downhole tool 12. Accordingly, the wellbore automation system 100 may instruct the downhole tool 12 to obtain the desired logging measurements 26 and transmit the logging measurements 26 to the data processing system 28 (e.g., the data acquisition system 118).

As discussed in greater detail below, the wellbore automation system 100 may continuously monitor certain operating parameters of the well-logging system 10 during operation of the well-logging system 10. For example, the wellbore automation system 100 may monitor measurements acquired by the downhole tool 12, the torque sensor 66, the strain gauge 74, the indicator spool 76, the one or more sensors 78, or any other suitable sensors of the well-logging system 10. In some embodiments, the wellbore automation system 100 may compare these parameters against corresponding target parameters, to determine whether a non-standard operating condition is detected (process block 164). For example, the target parameters may be indicative of efficient operating conditions of the well-logging system 10. Accordingly, a non-standard task may be indicative of a difference between a measured parameter and a target parameter exceeding a threshold value.

For example, a target operating tension of the cable 18 may be defined and input into the wellbore automation system 100 (e.g., stored in the memory device 116). The wellbore automation system 100 may monitor a tension within the cable 18 using the torque sensor 66 or any suitable sensors of the well-logging system 10. In some cases, an obstruction disposed within the casing 17 of the wellbore 16 may cause the downhole tool 12 to become stuck (e.g., substantially restricted from motion). Accordingly, a tension within the cable 18 may increase substantially if the winch 22 spools the cable 18 while the downhole tool 12 remains substantially stationary. As such, the tension within the cable 18 may exceed the target operating tension by a threshold amount. In such an example, the wellbore automation system 100 may generate an alert (e.g., a visual alert, and audio alert), and stop the winch 22 from spooling the cable 18. The wellbore automation system 100 may thus request (process block 166) operator input (e.g., manual input from the operator 102) before proceeding with autonomous operation of the well-logging system 10. In some embodiments, the wellbore automation system 100 may notify the OSC 132 and/or the base 134 when a non-standard operating condition is detected. Accordingly, the OSC 132, the base 134, or both, may remotely operate (e.g., via instructions transmitted to the automation controller 120 via the communication device 130) the well-logging system 10. If the tension within the cable 18 remains substantially equal to, or below the target operational tension, the wellbore automation system 100 may continue normal operation (process block 168) of the well-logging system 10.

In some embodiments, the wellbore automation system 100 may additionally request operator input before performing a previously specified non-standard task. For example, the low level job instructions may include instructions which specify along which portion(s) of the casing 17 (e.g., at which depth(s) 68) to generate perforations (e.g., punctures within the casing 17) using the downhole tool 12 (e.g., using a perforator coupled to the downhole tool 12). Accordingly, the wellbore automation system 100 may pause autonomous operation of the well-logging system 10 when the wellbore automation system 100 moves the downhole tool 12 substantially near the previously specified portion, or portion(s) of casing 17 to be perforated. As such, the operator 102, the OSC 132, the base 134, or any combination thereof, may approve the previously specified non-standard task before the automation controller 120 executes the non-standard task.

The wellbore automation system 100 may receive real time updates (process block 170) of the monitored operating parameters and/or the measured physical parameters of the wellbore 16 during operation of the well-logging system 10. As discussed above, the wellbore automation system 100 may monitor measurements acquire by the downhole tool 12, the torque sensor 66, the strain gauge 74, the indicator spool 76, the one or more sensors 78, or any suitable sensors of the well-logging system 10. In some embodiments, the wellbore automation system 100 may additionally monitor the video data generated by the cameras 108-114. The wellbore automation system 100 may update the simulated operational parameters (process block 172) generated by the TOOLPLANNER™ framework using the real-time updates. Accordingly, the TOOLPLANNER™ framework may continuously update the model of the well site during operation of the well-logging system 10. In some embodiments, the updated model may enhance performance of the automation controller 120, by enabling the automation controller 120 to adjust certain operational parameters (e.g., an unspooling speed of the winch 22) of the well-logging system 10 in response to the updated model. Accordingly, the wellbore automation system 100 may control substantially all operations of the well-logging system 10.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:
1. A well-logging system, comprising:
   a downhole tool coupled to a cable, wherein a first plurality of sensors is coupled to the downhole tool and configured to measure physical parameters of a wellbore;

wellbore equipment, wherein the wellbore equipment comprises at least a winch, and wherein the winch is configured traverse the downhole tool through the wellbore by spooling or unspooling the cable;
a second plurality of sensors, wherein the second plurality of sensors are configured to measure operational parameters of the wellbore equipment; and
an automation controller, wherein:
the automation controller is communicatively coupled to the first plurality of sensors and the second plurality of sensors;
the automation controller is configured to:
assemble the well-logging system, wherein as part of assembly of the well-logging system, the automation controller is configured to:
autonomously control a crane to position a lower assembly of pressure control equipment concentric to a cap of the wellbore; and
autonomously control the crane to concentrically align an upper assembly of the pressure control equipment with the lower assembly;
autonomously control the wellbore equipment based at least in part on feedback from the first plurality of sensors, feedback from the second plurality of sensors, and defined operating instructions;
as part of the autonomous control, the automation controller is configured to:
autonomously move the downhole tool to a portion of the wellbore specified by the defined operating instructions; and
autonomously instruct the downhole tool to obtain measurements and transmit the measurements to a data processing system;
generate a model of the wellbore based at least in part on the defined operating instructions;
update the model in response to the feedback from the first plurality of sensors, the second plurality of sensors, or both; and
adjust operational parameters based on the updated model.

2. The well-logging system of claim 1, comprising a remote communicatively coupled to the wellbore equipment, wherein the remote is configured to control the wellbore equipment.

3. The well-logging system of claim 2, comprising at least one camera, wherein the at least one camera is configured to monitor the wellbore equipment and transmit video data to the remote, and wherein the video data is displayed through a screen disposed on the remote.

4. The well-logging system of claim 1, wherein the first plurality of sensors comprise at least one of an accelerometer, a pressure transducer, a rate sensor, an electromagnetic sensor, an acoustic sensor, or any combination thereof.

5. The well-logging system of claim 1, wherein the second plurality of sensors comprise at least one of a torque sensor, a strain gauge, an indicator wheel, or any combination thereof.

6. The well-logging system of claim 1, wherein the wellbore equipment further comprises:
motorized rollers coupled to the pressure control equipment, wherein the motorized rollers facilitate movement of the cable through the wellbore;
a tool handling system disposed adjacent to the crane, wherein:
the crane is disposed adjacent to the pressure control equipment; and
the tool handling system and the crane are configured to facilitate assembly and operation of the well-logging system.

7. The well-logging system of claim 6, wherein the defined operation instructions comprise defined tasks to be performed by the wellbore equipment, wherein the defined tasks facilitate measuring the physical parameters of the wellbore.

8. The well-logging system of claim 1, wherein an external control center is communicatively coupled to the automation controller via a communication device, and wherein the external control center is configured to remotely control the automation controller.

9. A wellbore automation system, comprising:
a data acquisition system, wherein the data acquisition system is communicatively coupled to a first plurality of sensors coupled to a downhole tool, wherein the downhole tool is configured to measure physical parameters of a wellbore;
a second plurality of sensors, wherein the second plurality of sensors are configured to measure operating parameters of wellbore equipment of a well-logging system; and
an automation controller, wherein:
the automation controller is communicatively coupled the first plurality of sensors and the second plurality of sensors;
the automation controller is configured to:
assemble the well-logging system, wherein as part of assembly of the well-logging system, the automation controller is configured to:
autonomously control a crane to position a lower assembly of pressure control equipment concentric to a cap of the wellbore; and
autonomously control the crane to concentrically align an upper assembly of the pressure control equipment with the lower assembly;
control operation of the wellbore equipment based at least in part on feedback from the first plurality of sensors, the second plurality of sensors, and defined operating instructions; and
as part of the control, the automation controller is configured to:
autonomously move the downhole tool to a portion of the wellbore specified by the defined operating instructions;
autonomously instruct the downhole tool to obtain measurements and transmit the measurements to a data processing system;
generate a model of the wellbore based at least in part on the defined operating instructions;
update the model in response to the feedback from the first plurality of sensors, the second plurality of sensors, or both; and
adjust operational parameters based on the updated model.

10. The wellbore automation system of claim 9, wherein the defined operating instructions comprise executable instructions to be performed by the automation controller, and wherein the executable instructions specify tasks to be performed by the wellbore equipment.

11. The wellbore automation system of claim 9, wherein the first plurality of sensors comprise at least one of an accelerometer, a pressure transducer, a rate sensor, an electromagnetic sensor, an acoustic sensor, or any combination thereof, and wherein the second plurality of sensors comprise at least one of a torque sensor, a strain gauge, an indicator wheel, or any combination thereof.

12. The wellbore automation system of claim 9, further comprising a plurality of cameras disposed adjacent to the wellbore equipment, wherein the plurality of cameras are configured to generate real-time video data of the wellbore equipment.

13. The wellbore automation system of claim 12, wherein the real-time video data is displayed on a screen of a remote, wherein the remote is communicatively coupled to the automation controller such that an operator may control the wellbore equipment using the remote based at least in part on the real-time video data.

14. The wellbore automation system of claim 9, wherein the automation controller is configured to generate an alert when a difference between the operating parameters and a target value of the operating parameters exceeds a threshold value.

15. A method of operating a wellbore automation system, comprising:
receiving defined operating instructions, wherein the defined operating instructions comprise instructions for controlling wellbore equipment of a well-logging system and instructions for assembling the well-logging system;
executing the defined operating instructions by the wellbore automation system to assemble the well-logging system, wherein, assembling the well-logging system comprises:
autonomously controlling a crane to position a lower assembly of pressure control equipment concentric to a cap of the wellbore; and
autonomously controlling the crane to concentrically align an upper assembly of the pressure control equipment with the lower assembly;
measuring physical parameters of the wellbore using a first plurality of sensors, wherein the first plurality of sensors are coupled to a downhole tool disposed within the wellbore;
measuring operating parameters of the wellbore equipment using a second plurality of sensors; and
controlling the wellbore equipment based at least in part on the defined operating instructions, feedback from the first plurality of sensors, feedback from the second plurality of sensors, or any combination thereof;
wherein controlling the wellbore equipment comprises:
autonomously moving the downhole tool to a portion of the wellbore specified by the defined operating instructions; and
autonomously instructing the downhole tool to obtain measurements and transmit the measurements to a data processing system;
generating a model of the wellbore based at least in part on the defined operating instructions;
updating the model in response to the feedback from the first plurality of sensors, the second plurality of sensors, or both; and
adjusting operational parameters based on the updated model.

16. The method of claim 15, wherein the defined operating instructions comprise executable instructions to be performed by an automation controller of the wellbore automation system, wherein the automation controller is communicatively coupled to the wellbore equipment such that the automation controller may control the wellbore equipment.

17. The method of claim 15, further comprising:
detecting a non-standard operating condition when a difference between the operating parameters and a defined set of operating parameters exceeds a threshold value; and
stopping operation of the wellbore equipment when the non-standard operating condition is detected.

18. The method of claim 17, wherein an operator controls the wellbore equipment via a remote when the non-standard operating condition is detected.

19. The method of claim 15, wherein the first plurality of sensors comprise at least one of an accelerometer, a pressure transducer, a rate sensor, an electromagnetic sensor, an acoustic sensor, or any combination thereof, and wherein the second plurality of sensors comprise at least one of a torque sensor, a strain gauge, a indicator wheel, a video camera, or any combination thereof.

* * * * *